United States Patent [19]

Miller

[11] Patent Number: 4,829,350

[45] Date of Patent: May 9, 1989

[54] ELECTROSTATIC DISCHARGE INTEGRATED CIRCUIT PROTECTION

[75] Inventor: Bernard D. Miller, San Jose, Calif.

[73] Assignee: National Semiconductor Corporation, Santa Clara, Calif.

[21] Appl. No.: 190,619

[22] Filed: May 5, 1988

[51] Int. Cl.⁴ .................... H01L 27/04; H01L 29/78
[52] U.S. Cl. ................................. 357/23.13; 361/91
[58] Field of Search .................. 357/23.13, 13, 41, 42; 361/91

[56] References Cited

U.S. PATENT DOCUMENTS

| 4,609,931 | 9/1986 | Koike | 357/42 |
| 4,739,437 | 4/1988 | Morgan | 357/23.13 |
| 4,786,956 | 11/1988 | Puar | 357/23.13 |

FOREIGN PATENT DOCUMENTS 58-165369  9/1983  Japan ................. 357/23.13

*Primary Examiner*—William D. Larkins
*Attorney, Agent, or Firm*—Gail W. Woodward; Lee Patch; Mark Aaker

[57] ABSTRACT

A circuit and structure intended for use in CMOS IC designs acts to protect signal lines against ESD. An array of three transistors is connected so that the voltage pulse that appears on the signal line as a result of ESD, forces at least one transistor into conduction. The circuit responds equally to positive and negative pulses and is, therefore, symmetrical, and independent of bias or supply potentials. In the absence of an ESD pulse the circuit draws a very low leakage current and, therefore, has very little effect upon normal IC operation.

4 Claims, 1 Drawing Sheet

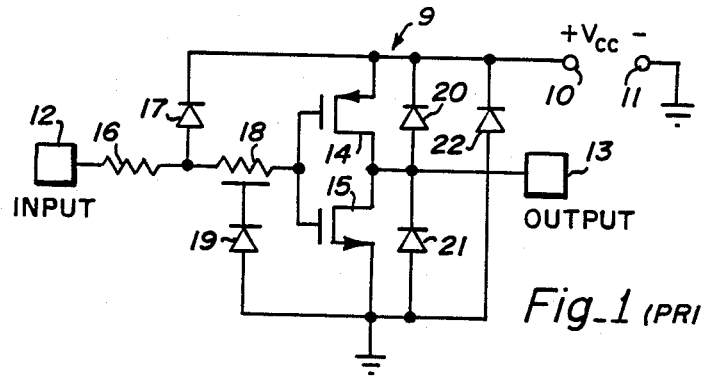
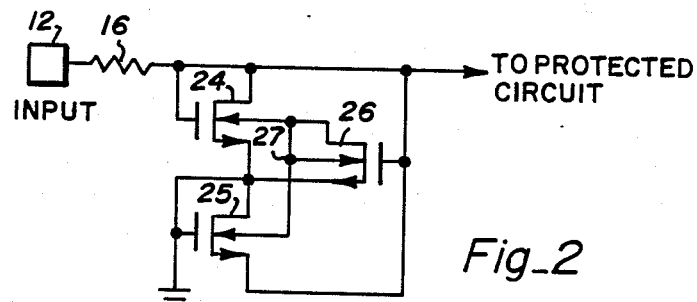
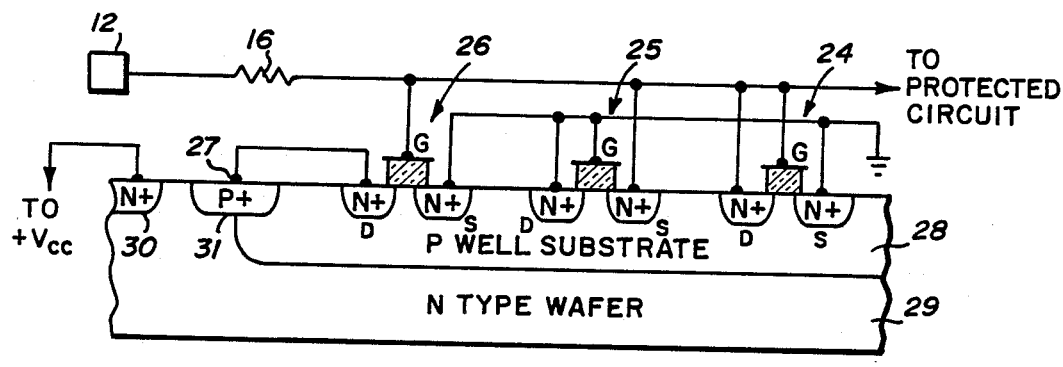
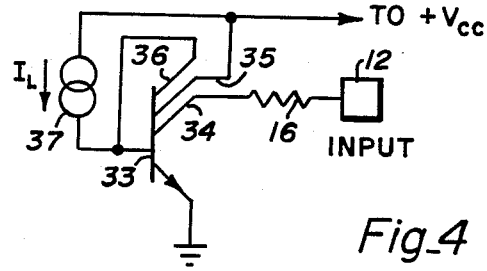

4,829,350

ELECTROSTATIC DISCHARGE INTEGRATED CIRCUIT PROTECTION

BACKGROUND OF THE INVENTION

Electrostatic discharge (ESD) is a phenomenon wherein static build-up, such as produced by friction, is applied to an object. When the object is an integrated circuit (IC) portions of the device can be permanently damaged. Since ESD can involve pulses of many thousands of volts the damage, which often involves the discharge of a capacitance of many tens of picofarads, can be surprisingly high. In testing the tolerance of an IC to ESD it is common to charge a 150 pF capacitor to a controlled variable voltage (typically 1 to 2 kilovolts) and then connect it through a 1.5k ohm resistor to the various pins of the IC. The signal input/output pins are typically the most sensitive to damage from ESD. The capacitor charge is incremented until damage occurs and the level noted. The ESD resistance can then be rated in terms of the highest value of charge voltage that the IC can withstand without harm.

With respect to what can happen when damage occurs, several failure mechanisms can develop. The discharge energy can melt the silicon into which the IC is fabricated. It can also rupture the silicon dioxide insulation. Here it is most likely that a metal oxide semiconductor (MOS) transistor gate oxide rupture will occur first because this oxide is the thinnest in the IC. Further, it can cause fusion of the aluminum interconnect metal or evaporate polysilicon conductors. The above actions usually destroy the IC. However, at lower ESD levels PN junctions can be degraded so that leakage currents can increase to an unacceptable level. Accordingly, the ESD limits are related to acceptable performance levels.

FIG. 1 shows a protected complementary MOS (CMOS) gate or NOT circuit. Such a circuit is commonly found in the commercial 74HC device series. The gate 9 operates from supply terminals 10 and 11 which respectively represent $+V_{CC}$ and ground. A signal applied to input terminal 12 appears inverted at output terminal 13. P channel transistor 14 in connection with N channel transistor 15 forms a CMOS inverter. The gates of transistors 14 and 15 are protected by elements 16-22. Resistor 16 is ordinarily a poly silicon resistance having a typical value of about 200 ohms. Diode 17 forms a clamp and conducts when input terminal 12 is force one diode drop above the potential on the $+V_{CC}$ line. Thus, assuming a 5-volt $V_{CC}$, diode 17 will clamp the right hand end of resistor 16 at about 5.6 volts (at 300° K.). Resistor 18 is actually a diffused resistor that forms the cathode of diode 19. Diode 19 will conduct and clamp the input gates when terminal 12 is forced one diode drop below ground. Thus, the gates are also clamped at about $-0.6$ volt (at 300° K.).

The above clamp levels are sufficiently low that the gates of transistors 14 and 15 are fully protected.

Elements 20-22 provide the protection associated with output terminal 13. When output terminal 13 is forced one diode drop above the potential of the $+V_{CC}$ line diode 20 will conduct and clamp the output. When terminal 13 is forced to one diode drop below ground diode 21 wil conduct and clamp the swing at about $-0.6$ volt (at 300° K.). Diode 22 is present to clamp the application of reverse potential between terminals 10 and 11. It will conduct when the reverse potential exceeds about 0.6 volt (at 300° K.).

In the normal circuit operation the applied potentials will reverse bias diodes 17, 19 and 20-22. In this state the shunting produced by the diodes is negligible. The circuit of FIG. 1 will protect against ESD to over 2,000 volts using the above-described test.

Another well known gate protection circuit is found in Borror et al. reissue U.S. Pat. No. 27,972. In the embodiments disclosed a P channel transistor is employed to protect an operating P channel transistor. Accordingly, a $-V_{DD}$ supply is employed with the $+$ supply terminal at ground. In one embodiment (FIG. 1) a conventional FET is coupled as a series resistor between the input terminal and the protected gate. The diode formed by the FET source appears across the input terminal to ground. The gate of this device is connected to $V_{DD}$ so that it is normally biased heavily on and will thus act as a relatively low value resistor. When the input terminal is forced one diode below ground, the FET related diode will clamp. When the input terminal is forced to within one threshold voltage above $V_{DD}$ the transistor will be turned off so as to disconnect the input from the protected gate.

In the second embodiment (FIG. 2) a shunt FET is employed with a series connected dropping resistor. The shunt FET employs a thick gate oxide and its drain is connected to its gate. Such a structure will have a threshold voltage that is higher than that of the protected MOS transistor (which has a thin oxide), but the threshold will still be much lower than the thin oxide rupture voltage. Therefore, when a high voltage is applied to the input terminal, the thick oxide FET will turn on and conduct and the voltage will be dropped across the series resistor. Under the normal circuit operation the thick oxide FET will be nonconductive and will thus have no effect.

As can be seen in the above prior art examples, the clamping potentials are not symmetrical. This condition is aggravated when a bias voltage is present at the supply terminals. It would be desirable to provide a protection circuit that is symmetrical and unrelated to the supply voltage.

SUMMARY OF THE INVENTION

It is an object of the invention to provide an ESD protection circuit that has symmetrical response that is not related to supply voltage.

It is a further object of the invention to provide an ESD protection circuit that does not degrade the normal performance of the protected circuit.

These and other objects are achieved as follows. The circuit involves three like conductivity MOSFETs preferably fabricated into a common substrate. A suitable substrate could be the P well in a CMOS structure. The first transistor has its gate and drain connected to the circuit to be protected and its source grounded. The second transistor has its gate and drain grounded and its source connected to the circuit to be protected. The third transistor has its source grounded, its gate connected to the circuit to be protected and its drain connected to the common substrate. The three transistors employ thick (or field) oxide under their gates so that they have relatively high threshold voltages. Therefore, under ordinary circuit conditions all three devices will be nonconductive and there will be little or no effect upon the circuit being protected.

Assuming N channel transistors, when the input line goes positive so that its potential exceeds the transistor threshold, the first transistor will turn on. Its conduction will clamp the protected circuit line at the threshold potential. It will be noted that when the first transistor conducts the third transistor will also conduct and its conduction will force the substrate potential to close to ground. This ensures that the first transistor will remain on as long as the input voltage exceeds the threshold value.

When the input line goes negative to the threshold value, it will pull the source of the second transistor below ground so it will turn on and conduct the charge on the input line to ground. When the input line goes negative the source to substrate diode in the second transistor will be forward biased so that the common substrate will be pulled to within one diode drop of the line voltage. This action will apply a reverse bias to the substrate so that the first and third transistors will remain off and the threshold voltage of the second transistor will be maintained at its normal value.

From the above description it is clear that the first and third transistors conduct the discharge currents and therefore should be made fairly large. Since the third transistor is employed only to clamp the substrate, it can be relatively small.

BRIEF DESCRIPTION OF THE DRAWING

FIG. 1 is a schematic diagram of a well known protection circuit.

FIG. 2 is a schematic diagram of the circuit of the invention.

FIG. 3 is a cross section of a section of a semiconductor wafer showing how the elements of the circuit of FIG. 2 are established.

FIG. 4 is a schematic diagram of the parasitic bipolar transistor present in the FIG. 3 structure.

DESCRIPTION OF THE INVENTION

FIG. 2 is a schematic diagram of the circuit of the invention. Three N channel metal oxide semiconductor (MOS) transistors 24–26 are fabricated into a common substrate as shown in FIG. 3. The substrate shown is a P well 28 in an N type wafer 29 as is common in CMOS structures. An N+ diffusion 30 makes an ohmic contact to wafer 29 and is returned to +$V_{CC}$ for biasing. P+ diffusion 31 forms an ohmic contact to P well 28 and comprises circuit node 27 which is the common transistor substrate or back gate connection. In FIG. 3 the metal IC interconnects are shown schematically as are the gate connections.

The gate and drain of transistor 24 along with the gate of transistor 26 and the source of transistor 25 are connected to the protected line that couples to the protected circuit. The sources of transistors 24 and 26 along with the gate and drain of transistor 25 are returned to ground. The drain of transistor 26 is connected to circuit node 27 which is the common substrate or back gate connection.

While not illustrated, it is to be understood that the transistor gates are separated from the semiconductor by means 13 of a thick or field oxide. As is well-known to anyone of ordinary skill in MOS technology, field oxide is a thick layer of silicon oxide provided in the areas between transistors to reduce capacitance and prevent parasitic FET action due to overlying conductors. Since such an oxide is typically about a micron thick the transistors shown will have a threshold ($V_T$) of about 20 volts.

When ESD is present and terminal 12 is pulsed positive, transistors 24 and 26 will turn on when their gate to source voltage exceeds about 20 volts. When transistor 26 turns on its drain will pull node 27 close to ground potential. When transistor 24 conducts it will conduct the ESD charge to ground thereby dissipating it.

When the ESD potential is negative the input will pull terminal 12 below ground and the source of transistor 25 will be negative with respect to its gate. When the source falls to about −20 volts transistor 25 will conduct the ESD charge to ground thereby dissipating it. For this negative ESD it can be seen that the diode formed between the source of transistor 25 and the P well substrate will be forward biased. Thus, with the negative ESD excursion this forward biased diode will pull node 27 to within one diode drop of the level on the protected device line. This action avoids the body effect in transistor 25.

When the ESD potential, either positive or negative, falls below about 20 volts all of the transistors will be below threshold and therefore nonconductive. Accordingly, under ordinary operating conditions the circuit does not have any adverse effect upon the circuit operation.

It is to be understood that while a P well CMOS embodiment has been disclosed the complement could be employed. In this embodiment a P type wafer would contain an N well substrate and P channel transistors created therein. This would occur in the use of N well CMOS structures. When this form is employed the +$V_{CC}$ and ground terminal polarities would be reversed The circuit operation would be the same, but the conduction polarities would be reversed.

The structure of the invention has an unobvious advantage that will be illustrated by reference to FIG. 4. Here a parasitic bipolar transistor 33 is illustrated. The emitter is composed of the sources of transistors 24 and 26 in parallel with the drain of transistor 25. The base is P well substrate 28 which is connected at node 27. A lateral collector 34 is composed of the drain and source respectively of transistors 24 and 25 and this drain is connected to input terminal 12 by way of resistor 16. Collector 35 is the vertical parasitic transistor collector in which the wafer to P well substrate junction acts as a collector. This collector is connected to +$V_{CC}$ which provides a reverse bias. Collector 36 is the drain of transistor 26 which is connected to the base or P well substrate at node 27. Current source 37 represents the current leakage $I_L$ which flows across the reverse biased PN junction due to the presence of +$V_{CC}$. Without collector 36 this base current would produce a current flow in collector 34 equal to the value of $I_L$ multiplied by the Beta of the parasitic lateral transistor. This augmented leakage current could be substantial. However, $I_L$ will largely flow in collector 36 which will act as a shunt. This will reduce the leakage current flowing in collector 34 to a value determined by the ratio in sizes between collectors 34 and 36. Thus, the leakage current as it affects input terminal will be only a few times $I_L$ rather than as much as one to two hundred times $I_L$.

The invention has been described and its operation detailed. When the above description is read by a person skilled in the art, alternatives and equivalents, within the spirit and intent of the invention, will be apparent. Accordingly, it is intended that the scope of the invention be limited only by the following claims.

I claim:

1. A semiconductor integrated circuit having first, second and third MOS transistors formed in a common substrate and each having individual source, drain and gate electrodes, said MOS transistors being interconnected to provide electrostatic discharge protection between a signal line and a common reference line, said interconnection comprising:

means commonly connecting said signal line, the gate and drain of said first MOS transistor, the source of said second transistor and the gate of said third transistor;

means commonly connecting said reference line, the sources of said first and third MOS transistors and the drain and gate of said second MOS transistor; and means for connecting the drain of said third MOS transistor to said common substrate.

2. The integrated circuit of claim 1 wherein said first, second and third MOS transistors are N channel CMOS devices fabricated into a common P well substrate.

3. The integrated circuit of claim 1 wherein said first, second and third MOS transistors are P channel CMOS devices fabricated into a common N well substrate.

4. The integrated circuit of claim 1 wherein a thick field oxide is provided over areas of said integrated circuit other than where said transistors are formed, and wherein said first, second and third MOS transistors each have a gate electrode located upon a gate oxide having a thickness approximately equal to that of the integrated circuit field oxide.

* * * * *